(12) United States Patent
Kanemaru et al.

(10) Patent No.: US 11,277,000 B2
(45) Date of Patent: Mar. 15, 2022

(54) DC ELECTRICAL CIRCUIT PROTECTION APPARATUS AND ARC DETECTION METHOD

(71) Applicant: Mitsubishi Electric Corporation, Chiyoda-ku (JP)

(72) Inventors: Makoto Kanemaru, Chiyoda-ku (JP); Mitsugi Mori, Chiyoda-ku (JP); Mitsuru Tsukima, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 223 days.

(21) Appl. No.: 16/304,398

(22) PCT Filed: Mar. 24, 2017

(86) PCT No.: PCT/JP2017/012065
§ 371 (c)(1),
(2) Date: Nov. 26, 2018

(87) PCT Pub. No.: WO2017/221493
PCT Pub. Date: Dec. 28, 2017

(65) Prior Publication Data
US 2019/0296539 A1    Sep. 26, 2019

(30) Foreign Application Priority Data

Jun. 21, 2016  (JP) .............................. JP2016-122422

(51) Int. Cl.
*H02H 3/38*    (2006.01)
*G01R 31/08*   (2020.01)
(Continued)

(52) U.S. Cl.
CPC .............. *H02H 3/38* (2013.01); *G01R 31/08* (2013.01); *G01R 31/1272* (2013.01);
(Continued)

(58) Field of Classification Search
CPC .. H02H 3/00; H02H 3/02; H02H 3/06; H02H 3/07; H02H 3/10; H02H 3/16; H02H 3/38;
(Continued)

(56) References Cited

U.S. PATENT DOCUMENTS 5,847,913 A * 12/1998 Turner ................... H01H 73/14
361/93.1
6,504,692 B1 * 1/2003 Macbeth .............. H02H 1/0015
361/42

(Continued)

FOREIGN PATENT DOCUMENTS

| CN | 103548226 A | 1/2014 |
| CN | 104488155 A | 4/2015 |

(Continued)

OTHER PUBLICATIONS

Combined Office Action and Search Report dated Jul. 25, 2019 in Chinese Patent Application No. 201780037251.9, 17 pages (with unedited computer generated English translation and English translation of categories of cited documents).

(Continued)

*Primary Examiner* — Kyle J Moody
*Assistant Examiner* — Jye-June Lee
(74) *Attorney, Agent, or Firm* — Xsensus LLP

(57) ABSTRACT

In a DC feed system configured by a plurality of DC electrical circuits being combined, when an arc fault occurs, it is difficult to identify a DC electrical circuit in which an arc has occurred. For this reason, a DC electrical circuit protection apparatus includes: a plurality of DC electrical circuits, each of which has a current sensor provided in at least one of a positive or a negative electrical path and has arc noise absorbing mechanism on the upstream side of the current sensor; and an arc detection device which compares (Continued)

respective arc noise signal strengths of the DC electrical circuits from current signals detected by the current sensors of the DC electrical circuits, and based on the signal strengths, identifies a circuit in which an arc has occurred, wherein a DC electrical circuit in which an arc has occurred is identified.

14 Claims, 13 Drawing Sheets

(51) Int. Cl.
| | |
|---|---|
| G01R 31/12 | (2020.01) |
| H02H 1/00 | (2006.01) |
| H02H 3/10 | (2006.01) |
| H02H 3/16 | (2006.01) |
| H02H 3/07 | (2006.01) |
| H02H 3/02 | (2006.01) |
| H02H 3/00 | (2006.01) |
| H02H 3/06 | (2006.01) |

(52) U.S. Cl.
CPC ............ *H02H 1/0015* (2013.01); *H02H 3/00* (2013.01); *H02H 3/02* (2013.01); *H02H 3/06* (2013.01); *H02H 3/07* (2013.01); *H02H 3/10* (2013.01); *H02H 3/16* (2013.01)

(58) Field of Classification Search
CPC ... H02H 1/0015; G01R 31/1272; G01R 31/08
See application file for complete search history.

(56) References Cited

U.S. PATENT DOCUMENTS

| | | | |
|---|---|---|---|
| 9,136,688 | B2 | 9/2015 | Laschinski et al. |
| 2010/0149700 | A1* | 6/2010 | Hastings ............. H02H 1/0015 |
| | | | 361/42 |
| 2013/0335861 | A1 | 12/2013 | Laschinski et al. |
| 2015/0077884 | A1* | 3/2015 | Behrends ................ H02J 3/383 |
| | | | 361/5 |
| 2016/0181799 | A1 | 6/2016 | Kanemaru et al. |
| 2017/0141722 | A1 | 5/2017 | Misumi |
| 2017/0179880 | A1* | 6/2017 | Merz ........................ H02H 7/20 |

FOREIGN PATENT DOCUMENTS

| | | | | |
|---|---|---|---|---|
| CN | 105474494 A | | 4/2016 | |
| DE | 10 2012 104 314 A1 | | 11/2013 | |
| JP | 2014-509396 A | | 4/2014 | |
| JP | 2014-134445 A | | 7/2014 | |
| JP | 2014134445 A | * | 7/2014 | |
| JP | 2015-524240 A | | 8/2015 | |
| JP | 2015-211606 A | | 11/2015 | |
| JP | 2016-32369 A | | 3/2016 | |
| WO | WO-2012116722 A1 | * | 9/2012 | ............ H02H 1/0015 |
| WO | WO-2015029458 A1 | * | 3/2015 | ............ H02S 50/00 |

OTHER PUBLICATIONS

Office Action dated Jan. 3, 2020 in Chinese Patent Application No. 201780037251.9 (with English machine translation).
International Search Report dated May 16, 2017 in PCT/JP2017/012065 filed Mar. 24, 2017.
Office Action dated Nov. 24, 2020 in German Patent Application No. 11 2017 003 081.1, 11 pages.

* cited by examiner

DC ELECTRICAL CIRCUIT PROTECTION APPARATUS AND ARC DETECTION METHOD

TECHNICAL FIELD

The present invention relates to a DC electrical circuit protection apparatus which, in order to protect DC electrical circuits from a DC arc, carries out a detection of an arc which has occurred in an DC electrical circuit and thus carries out a protection of the DC electrical circuit, and to an arc detection method.

BACKGROUND ART

Owing to the dissemination and expansion of the use of information terminals, to the IT modernization of equipment, and to the rise of cloud computing technology, the amount of data to be processed by a network server, or the like, has increased significantly in recent years. The larger the amount of data processed, the larger a power load applied on information and communication equipment. In general, these processes are carried out by the information and communication equipment of a data center, and approximately one third of power consumption is said to derive from the information and communication equipment. Because of this, a power-efficient, high-voltage DC feed system is being widely used in order to realize energy saving. With the system, it is reported that as it is possible to reduce a loss caused when converting DC to AC, power consumption can be reduced by 20% as compared with the current one.

However, as the high-voltage DC feed system feeds a DC voltage/current, as the name indicates, there exists the risk of damage from an electrical fire triggered by a DC arc fault. In the case of an AC electrical circuit, there always exists current zero, and so it is easy to extinguish an arc. On the other hand, in the case of a DC electrical circuit, a constant current continues to flow, and so no current zero exists, making it difficult to extinguish an arc which has once occurred. Also, when this kind of fault occurs, a current at which a breaker trips is not reached, and so it is difficult to detect an arc occurrence. Furthermore, a huge electrical circuit system, such as a data center, is largely affected, and it is necessary to identify the fault part, disconnect a portion having the fault, and avoid a halt of the entire system. For this reason, in such a case that an arc occurs in the DC electrical circuit, leading to a fault, it is necessary to establish a DC electrical circuit protection system which can detect the arc occurrence quickly and identify a fault part.

As a DC generation system which has been highly improved in the protection against the arc occurrence, PTL 1 proposes one including an arc detection device which has an arc noise analysis unit which, based on the noises of signals from current sensors, detects an arc which occurs in the DC generation system based on the noises of signals from current sensors; a current fluctuation analysis unit which, when the arc is detected in the arc noise analysis unit, analyzes output current fluctuations of individual strings (a series of module circuits connected in series) based on the signals from the current sensors, and based on the fluctuations of current values before and after the arc has been detected, identifies an arc occurrence part; and a switch control unit which controls opening and closing of switches based on a result of the arc identification in the current fluctuation analysis unit.

CITATION LIST

Patent Literature

PTL 1: JP-A-2015-211606

SUMMARY OF INVENTION

Technical Problem

The arc detection device proposed in PTL 1, as it utilizes the property specific to a solar power system, has a problem in that in a common DC electrical circuit, it is not possible to identify a DC arc occurrence part, and that in the case of a system, such as a DC feed system for a data center, which is configured by combining a plurality of DC electrical circuits, it is net possible to identity a DC electrical circuit in which an arc has occurred from among the plurality of DC electrical circuits.

The invention, having been made in order to solve the heretofore described problem, has for its object to identify a DC electrical circuit in which an arc has occurred from in a complex configuration configured of a plurality of DC electrical circuits, and disconnect the circuit in which the arc has occurred from the entire system, thus enabling an operation by a sound circuit.

Solution to Problem

In a DC feed system where a plurality of DC electrical circuits are connected to a common main line, there is provided a DC electrical circuit protection apparatus which includes a plurality of current sensors which are each provided in at least one of a positive or a negative electrical path in each of at least two of the plurality of DC electrical circuits; a plurality of arc noise absorber which are provided one on the upstream side of each of the plurality of current sensors and which each absorb an arc noise, which has occurred in one of the DC electrical circuits and flows in from the upstream side, so as not to cause the arc noise to propagate to any other DC electrical circuit; and an arc detection device which compares respective arc noise signal strengths of the DC electrical circuits from current signals detected by the plurality of current sensors of the DC electrical circuits, and based on the arc noise signal strengths, identifies a circuit in which an arc has occurred from among the plurality of DC electrical circuits.

Advantageous Effects of Invention

According to the invention, with respect to an arc fault which has occurred in a DC feed system in which a plurality of DC electrical circuits are connected to a common main line and which is provided with means which absorb arc noises so as not to cause an arc noise having occurred in one of the DC electrical circuits to propagate to any other DC electrical circuit, it is possible to identify an arc occurrence part and disconnect only an arc fault segment.

DESCRIPTION OF EMBODIMENTS

Embodiment 1

Figure 1:
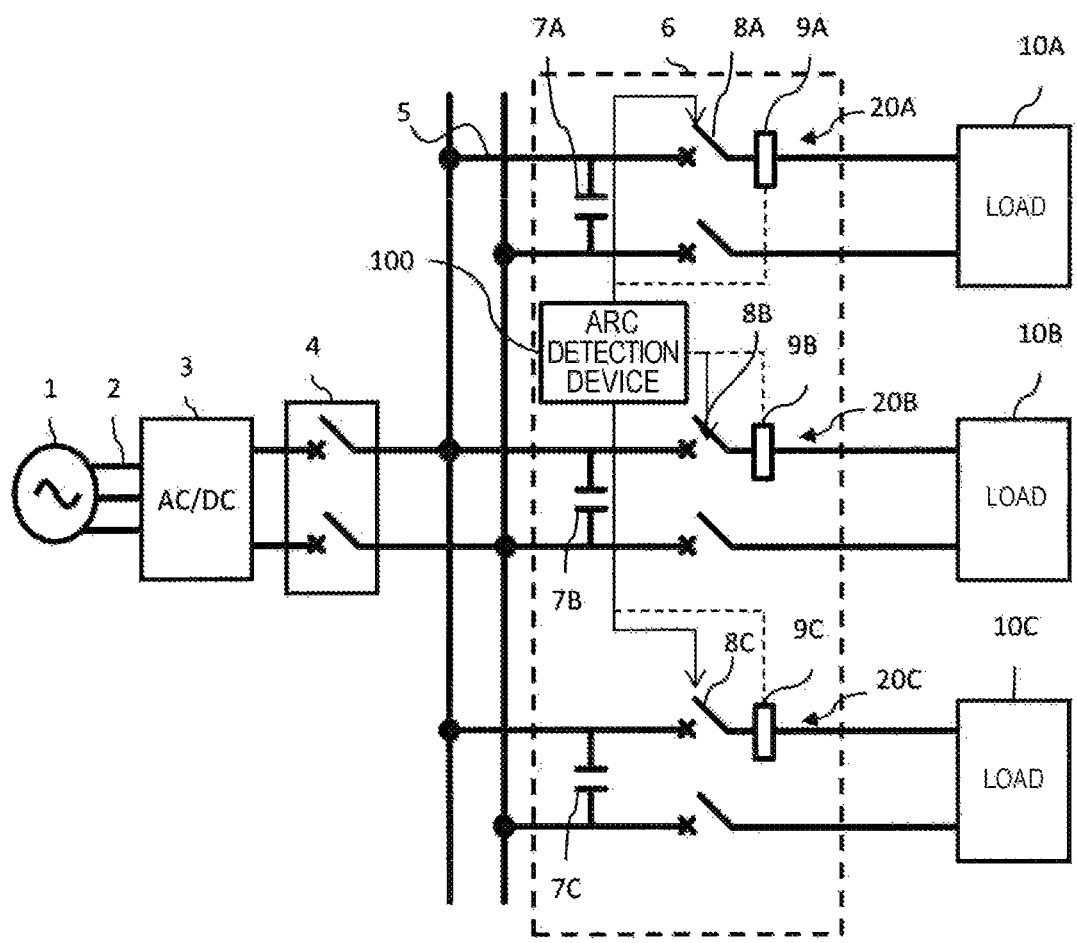
FIG. 1 is a configuration diagram showing a configuration of a DC feed system according to Embodiment 1 of the invention.

FIG. 1 is a circuit diagram showing a schematic configuration of a DC feed system according to Embodiment 1 of the invention. An AC power source 1 is connected to the input terminals of an AC/DC converter circuit 3 via AC electrical paths 2. There is also a case where a plurality of the AC/DC converter circuits 3 are connected in parallel to the AC power source 1. The output terminals of the AC/DC converter circuit 3 are connected to a breaker 4 and, passing through their respective main lines from the breaker 4, are each divided into a plurality of electrical paths 5. The individual electrical paths 5 are connected to a distribution board 6. A plurality of DC electrical circuits 20A, 20B, 20C connected respectively to a plurality of loads 10A, 10B, 10C are provided inside the distribution board 6. Capacitors 7A, 7B, 7C are each provided between a positive and a negative electrical path, switches 8A, 8B, 8C are provided one in each of the positive and negative electrical paths, and current sensors 9A, 9B, 9C are provided one in either the positive or negative electrical path, inside the respective DC electrical circuits 20A, 20B, 20C. The current sensors 9A, 9B, 9C are disposed so as to be positioned respectively closer to the loads 10A, 10B, 10C than the capacitors 7A, 7B, 7C.

A configuration is such that the current sensors 9A, 9B, 9C of the DC electrical circuits 20A, 20B, 20C detect the currents of the DC electrical circuits 20A, 20B, 20C, respectively, and that the outputs of results of the detections are sent to an arc detection device 100. In the case of an actual data center, sometimes, there exist three or more electrical paths 5, but FIG. 1 only illustrates three electrical paths 5 for convenience. In the drawing, identical signs show respective identical or equivalent portions.

Figure 2:
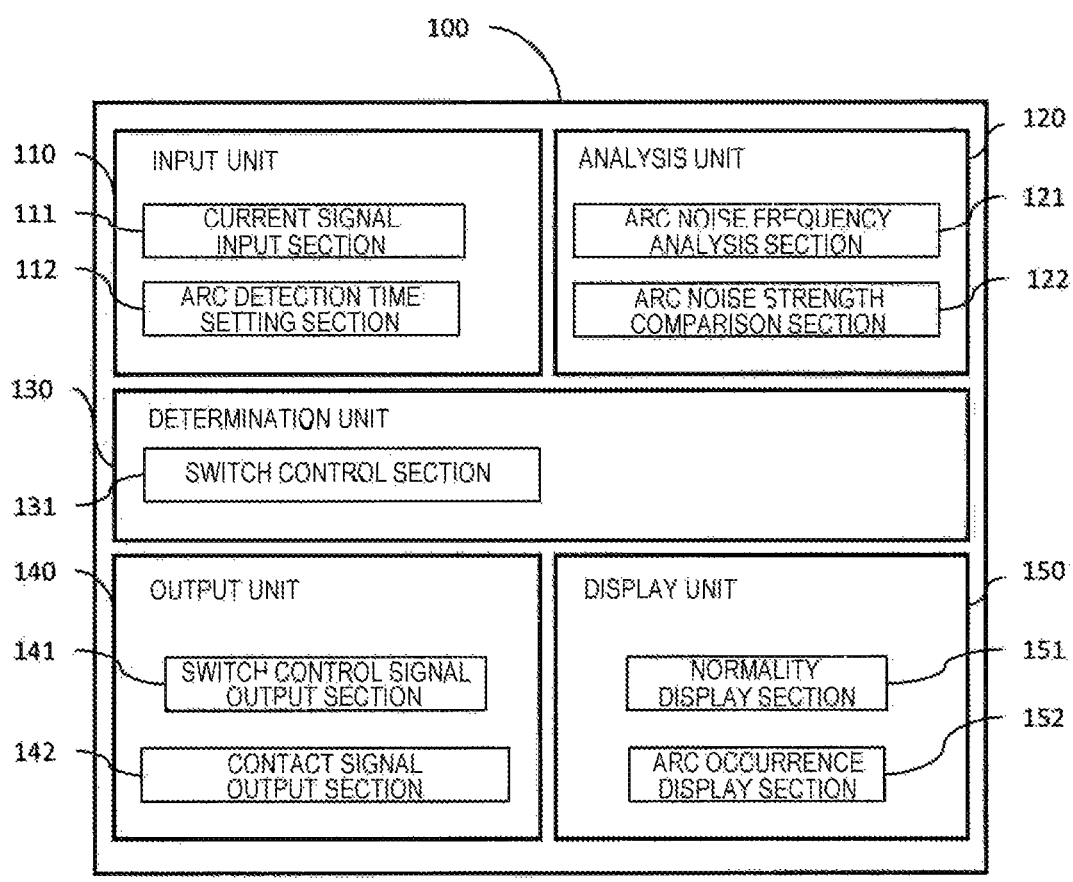
FIG. 2 is a block diagram showing a configuration of an arc detection device of the DC feed system according to Embodiment 1 of the invention.

FIG. 2 is a block diagram showing a configuration of the arc detection device 100 of the DC feed system according to Embodiment 1 of the invention. As shown in FIG. 2, the arc detection device 100 is divided into an input unit 110, an analysis unit 120, a determination unit 130, an output unit 140, and a display unit 150.

The input unit 110 includes a current signal input section 111 and an arc detection time setting section 112. The input unit 110 brings signal data of the currents detected by the current sensors 9A, 9B, 9C into the arc detection device 100 through the current signal input section 111. The data brought in are transmitted to the analysis unit 120. Also, the arc detection time setting section 112 sets time information of an arc detected.

The analysis unit 120 includes an arc noise frequency analysis section 121 and an arc noise signal strength comparison section 122. The arc noise frequency analysis section 121 carries out a process of converting a high frequency noise caused when an arc occurs from time sequence data to frequency sequence data. As the process of conversion from time sequence data to frequency sequence data, there is not only an FFT analysis, but a method of using a bandpass filter which only extracts the signal strength of a specific frequency band. Alternatively, there is, for example, a method of taking the product of a Gaussian function and the sine wave of a frequency intended to be extracted. In the arc noise signal strength comparison section 122, the arc noise signal strengths of the DC electrical circuits 20A, 20B, 20C are compared based on analyzed frequency sequence data, thus carrying out an analysis for identifying an arc occurrence part. For example, when a DC electrical circuit has a largest signal strength which is larger by a certain value or more than the signal strength of any other DC electrical circuit 20A, 20B, 20C, it is determined that the DC electrical circuit is a circuit in which an arc has occurred. Furthermore, means which captures a steep current fluctuation caused when an arc occurs can be added. The steep current fluctuation is a phenomenon which occurs only in an arc fault occurrence segment, and is combined with a result of the arc noise strength comparison, thereby enabling a highly accurate detection of the arc fault occurrence segment. However, it is possible simply to identify the arc fault occurrence segment only with the arc noise comparison.

When comparing the arc noise strengths in the arc noise signal strength comparison section 122, the arc noise strength comparison is carried cat based on the current signals of all the current sensors 9A, 9B, 9C corresponding respectively to all the DC electrical circuits 20A, 20B, 20C, leading to a reliable extraction of a circuit in which an arc has occurred.

Also, in the arc noise signal strength comparison section 122, current signals within a frequency range of, preferably, 10 kHz to 100 kHz are strength compared based on a result of FFT analyzing a signal from a current sensor, such as a Hall element or a Rogowski coil, which can measure current. The frequency range of 10 kHz to 100 kHz is a frequency range in which it is easy to detect an arc noise in terms of arc characteristics. In a range of 10 kHz or less, it is difficult to distinguish between a harmonic component of a power frequency (50 Hz, 60 Hz, or the like), which is generated from the DC/AC converter circuit 3, and an arc noise. Also, at 100 kHz or more, it is difficult to distinguish between the harmonic component and an electromagnetic wave noise or the like. For this reason, focus on the signals of 10 kHz to 100 kHz enables an improvement in arc detection accuracy.

Based on a result from the analysis unit 120, in the determination unit 130, a switch to be electrically disconnected is selected from among the switches 8A, 8B, 8C. Based on a result from the arc noise signal strength comparison section 122, a switch control section 131, on receiving the result, selects the switch 8A, 8B, 8C of a circuit to be electrically disconnected.

The output unit 140 includes a switch control signal output section 141 and a contact signal output section 142. Based on a result from the switch control section 131 of the determination unit 130, the switch control signal output section 141 outputs a signal for electrical disconnection to one of the switches 8A, 8B, 8C. By so doing, an electrical path 5 out of those of the DC electrical circuits 20A, 20B, 20C, which is in the arc occurrence segment and in which an arc is determined to have occurred, is disconnected, enabling the loads 10A, 10B, 10C to be protected from the arc. Furthermore, in a huge system, such as a data center, the control of operating information of communication equipment is centralized, and so an operator, based on a contact signal outputted from the contact signal output section 142, can confirm in a centralized control room, or the like, where an arc has occurred. The confirmation in the centralized control room is made not only based on the contact signal, but may be made based on another signal.

The display unit 150 includes a normality display section 151 and an arc occurrence display section 152. When the arc detection device 100 is in normal operation, a display showing that, it is in normal operation is carried out on the normality display section 151. A display from which it can be seen that an arc has occurred in an electrical path is carried out on the arc occurrence display section 152.

After an electrical path 5 in which an arc has occurred is electrically disconnected by the switch 8A, 8B, 8C, the switch 8A, 8B, 8C can be made conductive by applying a trigger to the breaker 4, for example, by remote control. The trigger can be manually operated. Also, it is also possible to automatically send the trigger to the breaker 4 in a certain time after a circuit in which an arc has occurred is electrically disconnected by the switch 8A, 8B, 8C and thus to make the switch 8A, 8B, 8C conductive. The certain time is preferably on the order of several minutes to several tens of minutes. In the event that an arc is detected again after the switch 8A, 8B, 8C is automatically made conductive, the electrical path 5 in which the arc has occurred is electrically disconnected again by the switch 8A, 8B, 8C. Subsequently, a trigger is automatically sent to the breaker 4 in a certain time, making the switch 8A, 8B, 8C conductive. This is repeated within a predetermined period, and when the number of repetitions reaches a predetermined number of times, this operation is stopped, and a warning is displayed. For example, the operation is repeated up to five times a day, and when the number of repetitions is more than five times, the switch 8A, 8B, 8C stops being made conductive.

When no more arc is detected after the switch 8A, 8B, 8C is automatically made conductive, the normal operation shall be carried out. With respect to a series arc occurrence, there is a case where after a circuit in which an arc has occurred is electrically disconnected by the switch 8A, 8B, 8C, thus extinguishing the arc, the insulation of an arc occurrence portion is recovered, leading to conduction without generating an arc again. A trigger is automatically sent to the breaker 4, making the switch 8A, 8B, and 8C conductive, thereby enabling the system to be restored quickly.

Figure 3:
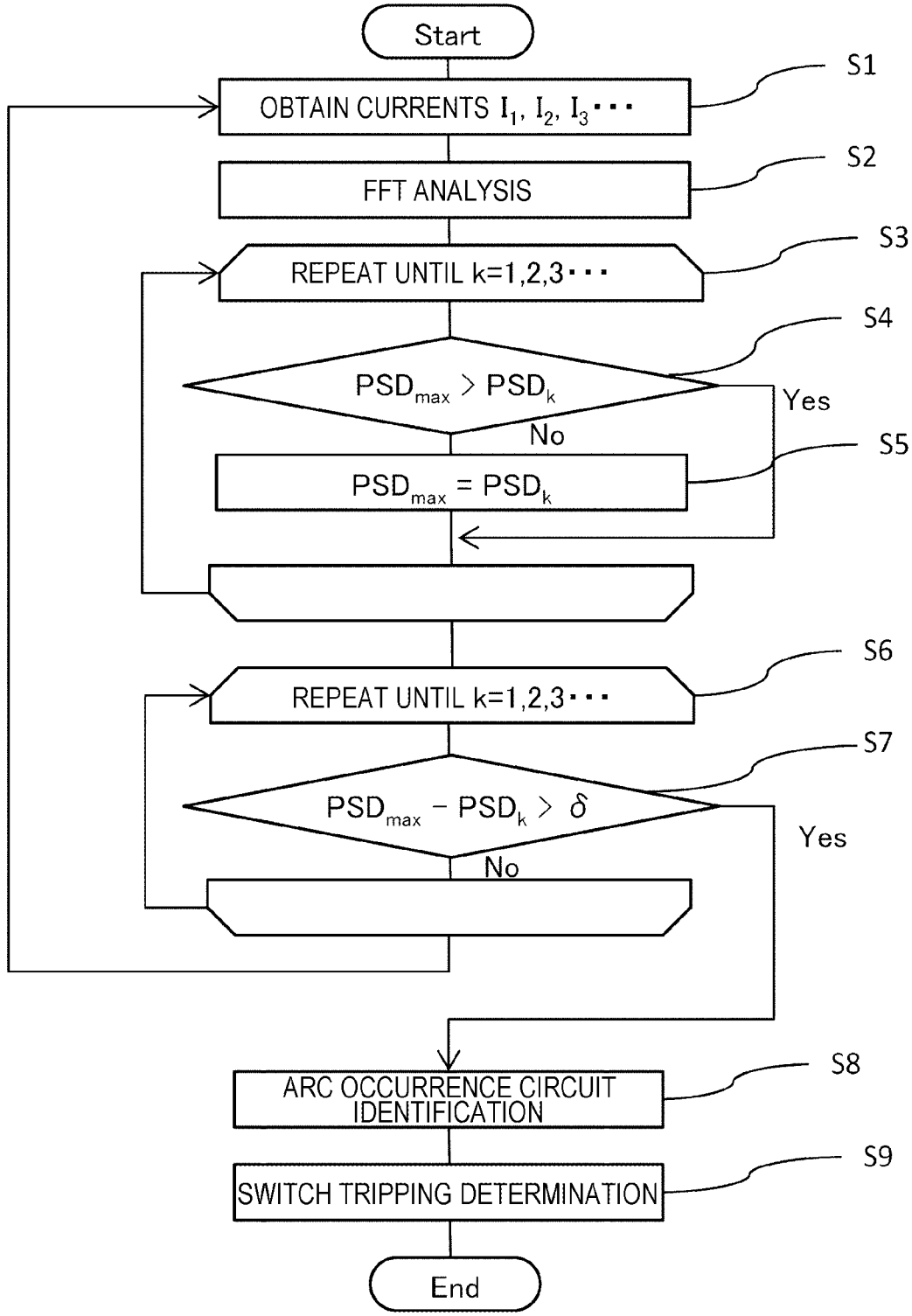
FIG. 3 is a flowchart of an arc detection of the DC feed system according to Embodiment 1 of the invention.

FIG. 3 is a flowchart describing an operation of the arc detection device 100, shown in FIG. 2, of the DC feed system according to Embodiment 1. In the arc detection device 100, current signals I1, I2, I3 inputted thereinto through the input unit 110 are updated (step S1), and an arc noise frequency analysis, such as an FTT analysis, is implemented in the arc noise frequency analysis section 121 (step S2). Next, in order to compare results of the arc noise frequency analyses of the individual DC electrical circuits 20A, 20B, 20C, the signal strengths of the individual DC electrical circuits are compared (step S3). Herein, k represents the number of times that the arc noise signal strength per DC electrical circuit is inputted, showing that the DC electrical circuits are switched in turn and that analysis results are collated in sequence. For example, when the arc noise signal strength of the first DC electrical circuit 20A is maximum (PSDmax), it is compared with the arc noise signal strength of another DC electrical circuit. That is, the arc noise signal strength of the first DC electrical circuit 20A is compared with a kth inputted DC electrical circuit's arc noise signal strength (PSDk) (step S4). At this time, when the kth DC electrical circuit's arc noise signal strength is larger, the kth DC electrical circuit's arc noise signal strength is updated as PSDmax (step S5). The comparison and updating are carried out on all the DC electrical circuits connected to the arc detection device 100. PSD stands for power spectral density and denotes a power distribution per unit frequency.

Herein, the number of circuits to be compared, and determined is defined to be N. The comparison is repeated until the number of times k that the arc noise signal strength is inputted exceeds the number of circuits N, and steps S3 to S5 are repeated. Then, a DC electrical circuit having a largest one of the values of the arc noise signal strengths of the individual DC electrical circuits in the PC feed system is determined. Next, the largest signal strength and the signal strengths of the individual circuits are compared (step S6). The difference between the arc noise signal strength of a DC electrical circuit having the largest value and that of another electrical path is compared with a threshold value δ (step S7). The comparison is also carried out repeatedly until the number of times k exceeds the number of circuits N. Then, when a result of the comparison shows the threshold value δ or more, a circuit having the arc noise signal strength is identified as an arc occurrence circuit (step S8). Then, a switch to be electrically disconnected is selected by the switch control section 131, breaking the circuit (step S9). An electrical circuit in which an arc has occurred can be disconnected in this way. It is possible to set a threshold value δ for arc part determination in advance. Alternatively, instead of setting the threshold value in advance, it is also possible to obtain a plurality of current signal data after attaching the device to the circuits, and thereby to statistically calculate and set a threshold value.

When an accidental breakage or disconnection occurs in a loaded wire, in general, a DC arc is formed between the leading ends of a circuit portion connected to the wire. The DC arc occurs between the leading ends of a broken wire, in the vicinity of a terminal block, in the vicinity of a plug, or the like, due to a cable deterioration or laying error, a screw loose, or the like.

Herein, a DC arc is assumed mainly to be a series arc. When a series arc occurs, an arc noise occurs generally in a range on the order of 1 kHz to 1 MHz. An arc noise has a property of 1/f, and in the case of a solar power system, a micro-noise is superimposed on all circuits. As there is a clear distinction particularly in a range of 1 kHz to 100 kHz as compared with the noise strength when no arc occurs, a high frequency noise in the range of at least 1 kHz to 100 kHz is detected as an arc noise superimposed on current, and thereby it is possible to determine an arc occurrence. Arc noise propagation is known. However, in the case of a solar power system, when an arc occurrence is determined only by an arc noise, all arc detection devices determine that there are arc occurrences in a plurality of parallel circuits. The reason is that the arc noise is propagated to all the circuits. However, with the configuration of Embodiment 1 of the invention, the capacitors for preventing a momentary voltage drop are provided in the electrical paths of the DC electrical circuits of the DC feed system, and so a circuit in which an arc has occurred and a circuit in which an arc has not occurred are different in their arc noise signal strengths which are detected by the current sensors provided in the respective circuits.

Figure 4:
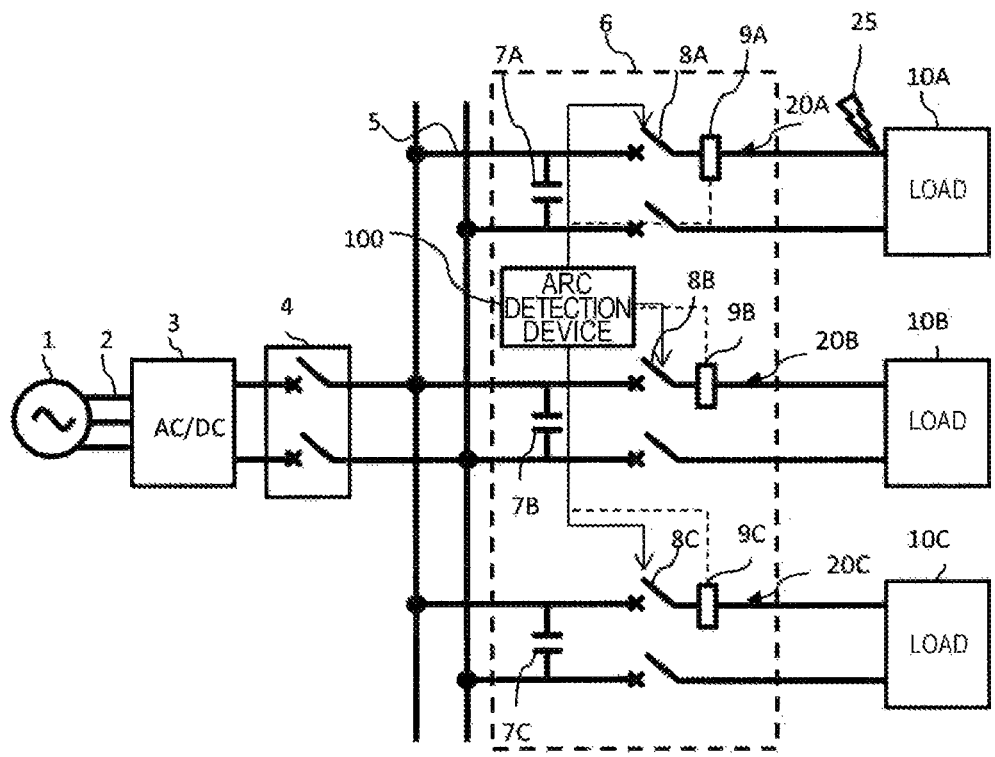
FIG. 4 is a schematic diagram for describing a situation when a DC arc has occurred in a DC electrical path in the DC feed system according to Embodiment 1 of the invention.

FIG. 4 shows a schematic diagram when an arc occurs. An arc occurrence part is assumed to be a part in which an arc occurs between the capacitor 7A, 7B, 7C and the load 10A, 10B, 10C. The arc occurrence part may be on either the upper or lower side of the current sensor 9. When there is a parallel arc, or there is a short circuit between the positive and negative electrical paths, the breaker operates, and so a failure incident due to a series arc is assumed herein. Alternatively, the case in which an arc having occurred when the plug is pulled out is not extinguished as assumed is also included.

Figure 5:
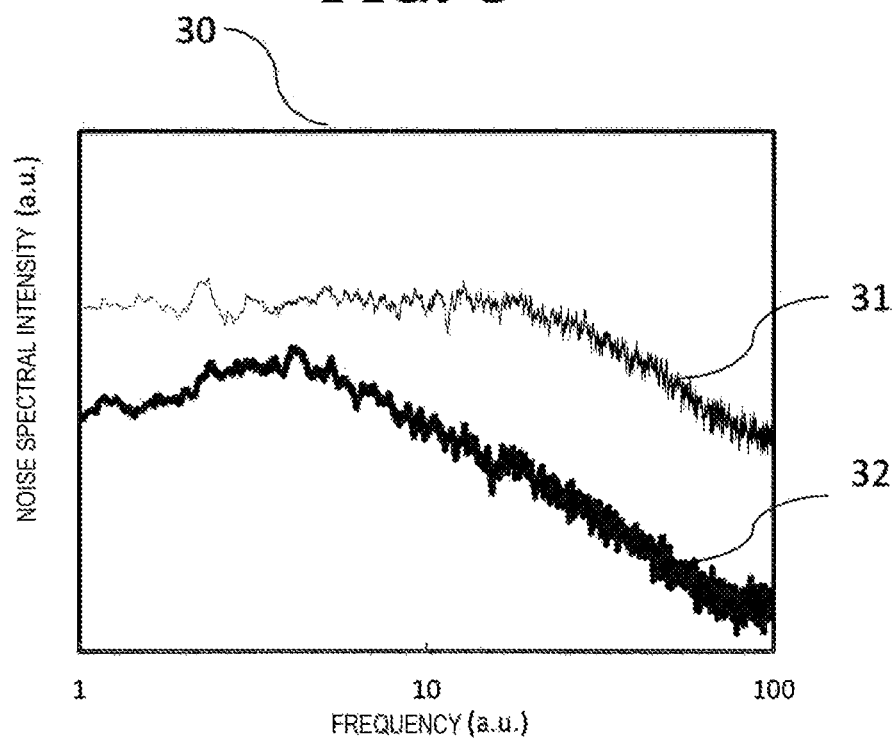
FIG. 5 is a characteristic diagram representing noise signal strengths in the DC feed system according to Embodiment 1 of the invention.
Figure 6:
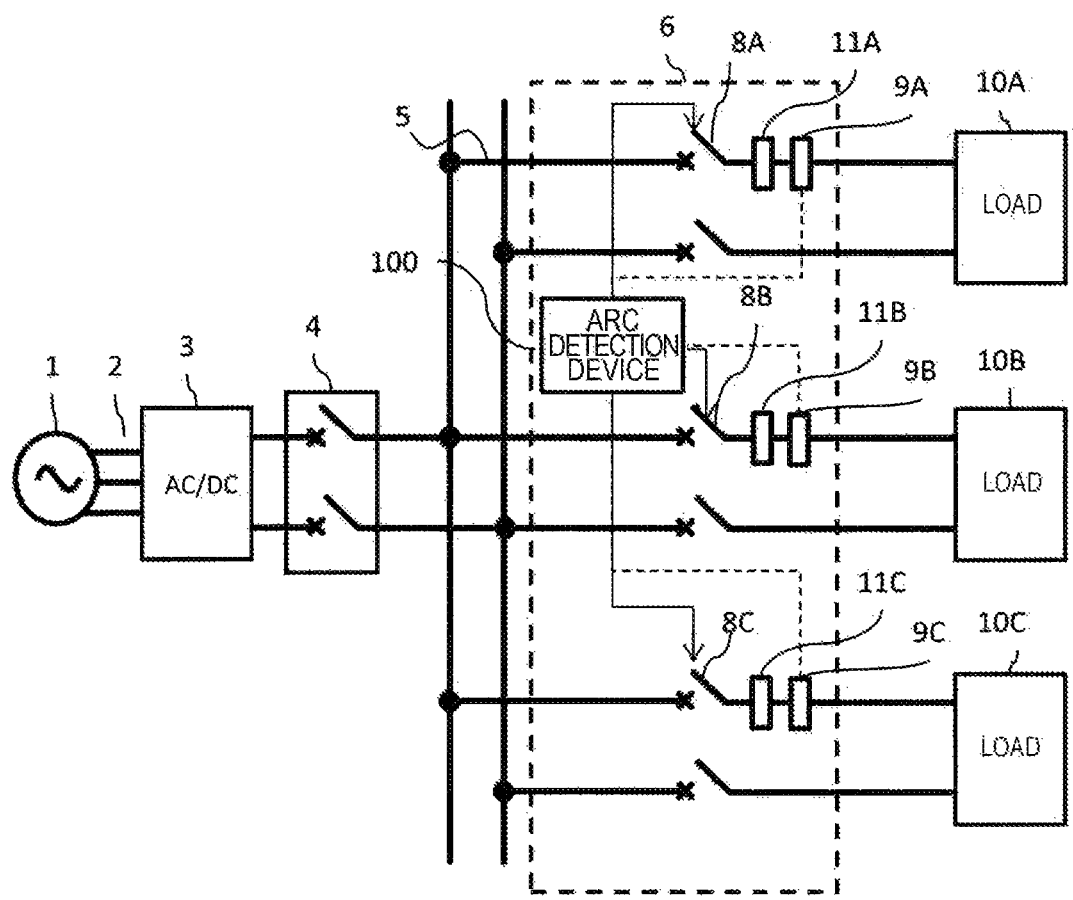
FIG. 6 is a configuration diagram showing a configuration wherein filters are each provided on the upstream side of a current sensor, in the DC feed system according to Embodiment 1 of the invention.

FIG. 5 shows an example of an arc noise strength when an arc 25 occurs in a part to which the load is connected, as shown in FIG. 4.

FIG. 5 is a characteristic diagram representing a noise spectral intensity waveform 30 with a frequency represented on the horizontal axis and a noise spectral intensity represented on the vertical axis. The diagram shows a noise signal strength 31 of an arc occurrence circuit and a noise signal strength 32 of an arc non-occurrence circuit. The noise signal strength 31 of the arc occurrence circuit is larger than the noise signal strength 32 of the arc non-occurrence circuit. This is because the capacitor 7 between the positive and negative electrical paths, which is installed for the purpose of preventing a momentary voltage drop of the DC feed system, serves as a filter. No arc noise is propagated to any other circuit owning to the existence of the capacitor 7. Also, as an inverter noise which occurs in the AC/DC converter circuit 3 is also reduced by the capacitor 7, it is easy to detect an arc noise.

In the event that the capacitor 7 is not installed between the positive and negative electrical paths, the current sensors 9A, 9B, 9C are provided with filters 11A, 11B, 11C, respectively, and thereby it is possible, in the same way, to use an arc noise in determining the distinction between the arc occurrence circuit and the arc non-occurrence circuit. That is, the filter 11 is provided on the upstream side of the current sensor aa means which has the function of absorbing an arc noise, thereby enabling the distinction between the arc occurrence circuit and the arc non-occurrence circuit to be determined using an arc noise. Herein, the filter 11 is a filter which cuts a signal of 10 kHz to 100 kHz. Also, it is preferable that filters which absorb an arc noise are provided one on each of the electrical path high-voltage and low-voltage sides.

Figure 7:
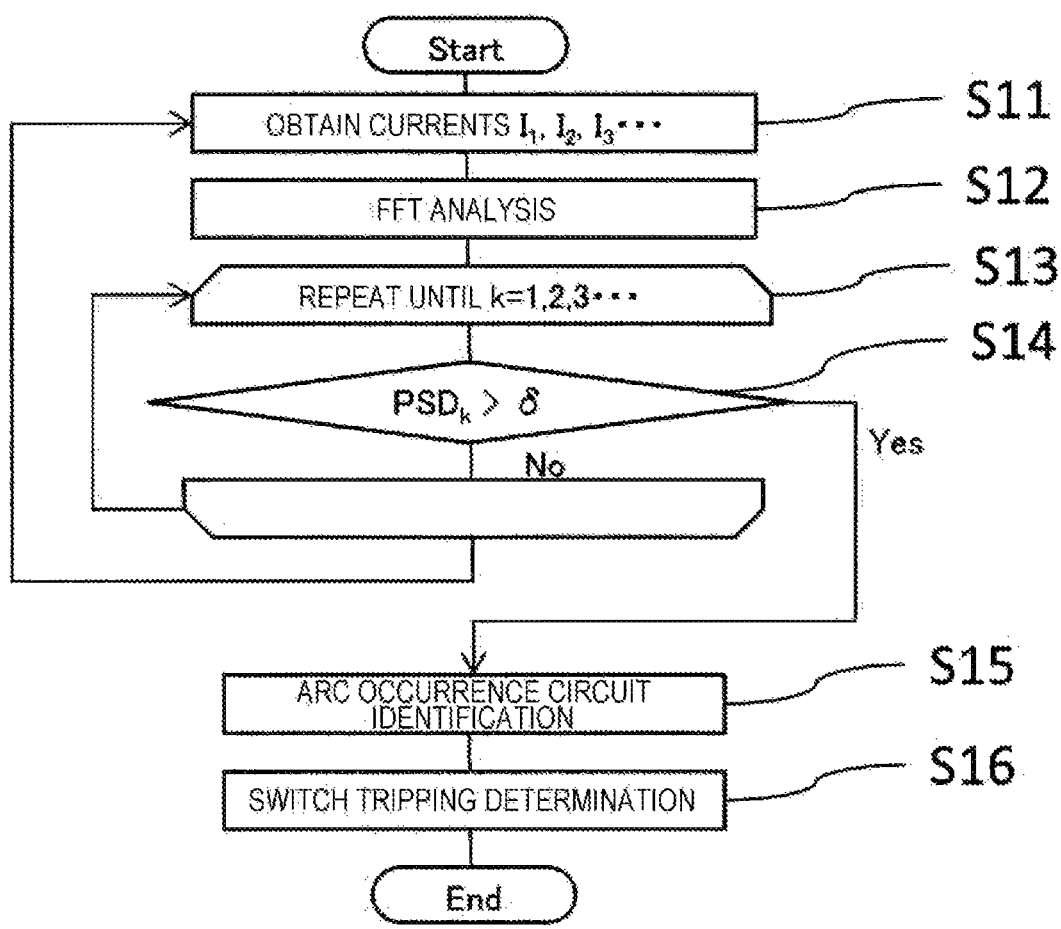
FIG. 7 is a flowchart of an arc detection of the DC feed system according to Embodiment 1 of the invention.

FIG. 7 is a flowchart describing another operation of the arc detection device 100, shown in FIG. 2, of the DC feed system according to Embodiment 1. A current signal inputted from the input unit 110 is updated in the arc detection device 100 (step S11), and an arc noise frequency analysis is implemented in the arc noise frequency analysis section 121 (step S12). Next, in order to compare results of the arc noise frequency analyses of the individual DC electrical circuits 20A, 20B, 20C, the signal strengths of the individual DC electrical circuits are compared (step S13). Subsequently, the arc noise signal strengths of the electrical paths and the threshold value δ are compared (step S14). This is repeated in sequence, and the comparison is carried out repeatedly until the number of comparisons k exceeds the number of circuits N. When an arc noise signal strength is equal to or more than the threshold value δ, a circuit having the arc noise signal strength is identified as the arc occurrence circuit (step S15). Then, a switch to be electrically disconnected is selected by the switch control section 131 (step S16), breaking a circuit whose arc noise signal strength is equal to or more than the threshold value δ, thus protecting the other circuits from an arc.

Embodiment 2

Figure 8:
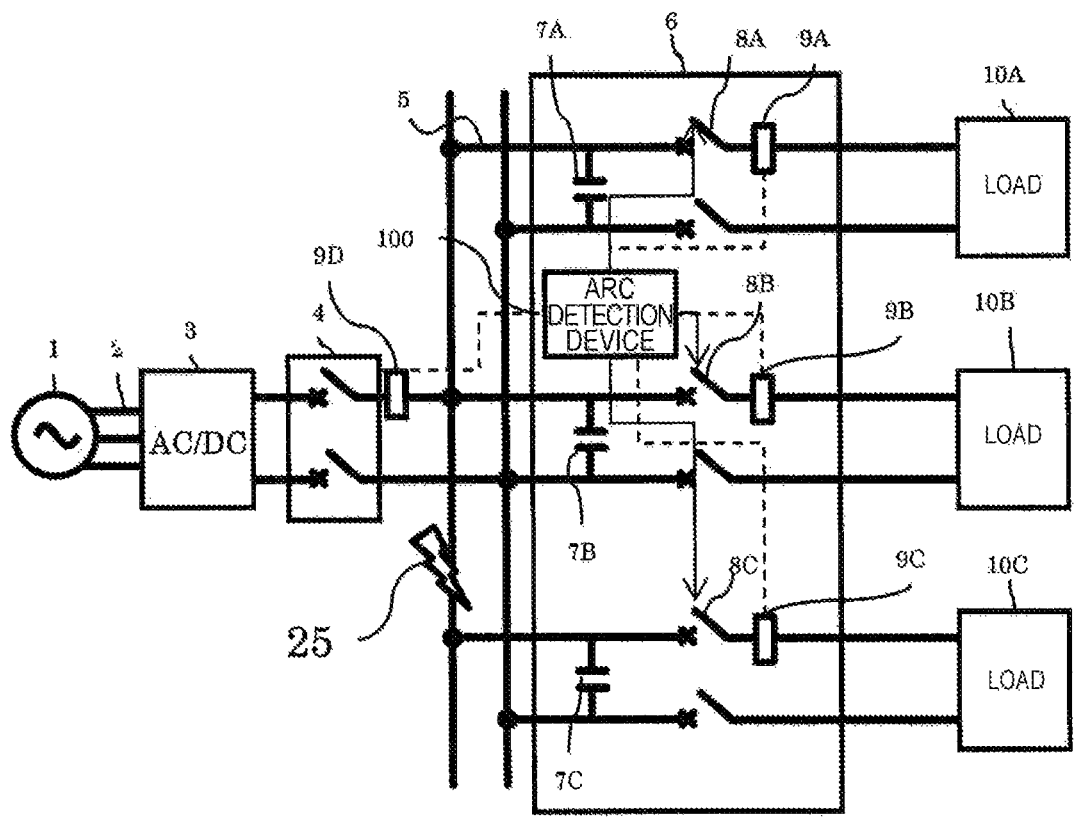
FIG. 8 is a configuration diagram showing a configuration of a DC feed system according to Embodiment 2 of the invention.

FIG. 8 shows, as Embodiment 2, a configuration wherein a current sensor 9D is added to the junction of the positive and negative electrical paths. In the drawing, signs identical to the signs used in FIG. 1 show respective identical or equivalent portions. By adding the current sensor 9D to the junction of the positive and negative electrical paths, it is possible to detect an arc 25 which has occurred in the electrical path at the junction. Because of this, it is possible to expand the segment in which to be able to detect an arc occurrence. The detection of the occurrence of the arc 25 can be carried out by using the arc noise frequency analysis section 121 and the arc noise strength comparison section 122 which are the same as in Embodiment 1.

Figure 9:
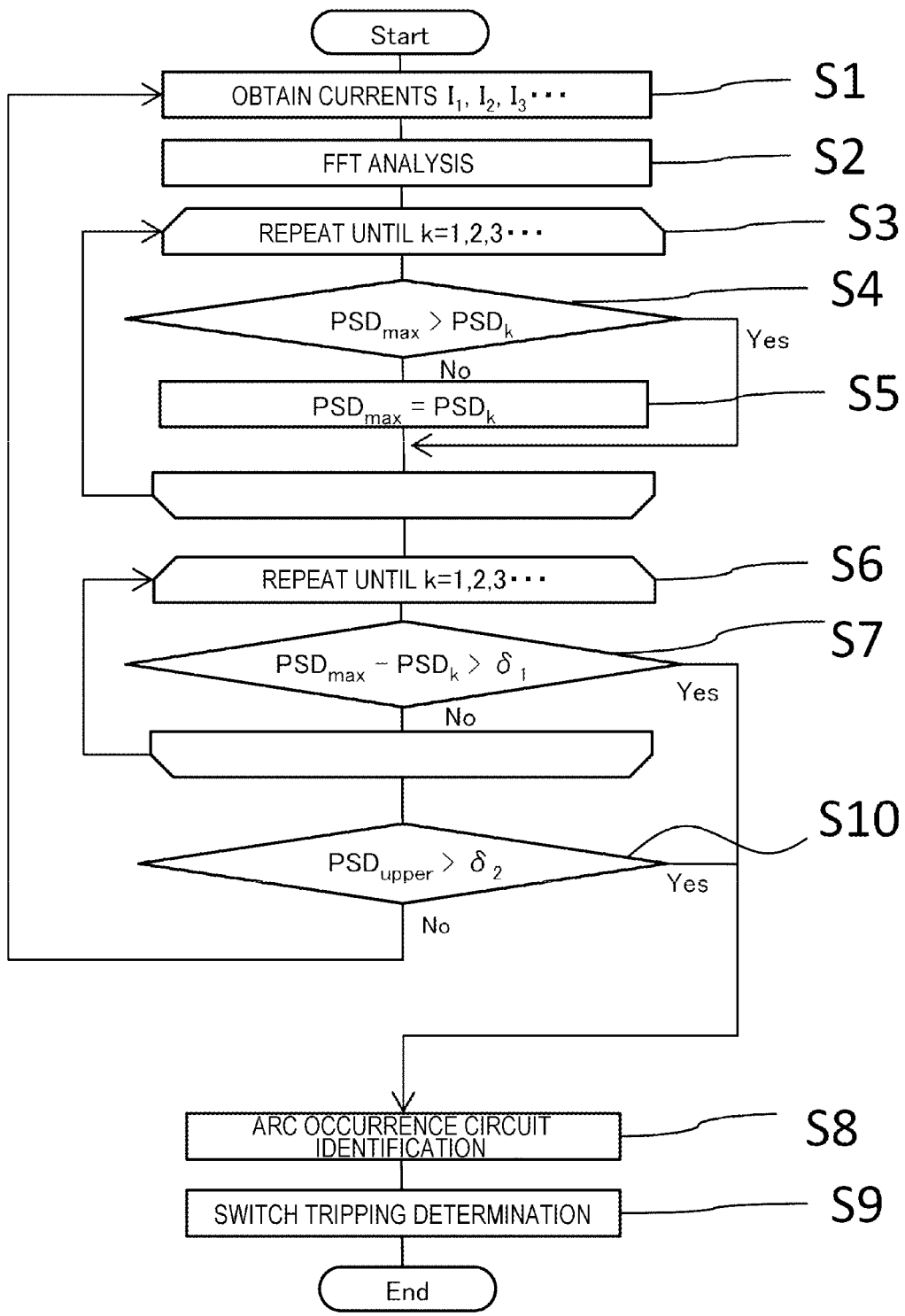
FIG. 9 is a flowchart of an arc detection of the DC feed system according to Embodiment 2 of the invention.

FIG. 9 is a flowchart describing an operation of an arc detection device 100 of a DC feed system according to Embodiment 2 of the invention. Steps 1 to 7 and steps 8 and 9 are the same as in FIG. 3. Step 10 is inserted between steps 7 and 8. In this case, in step 7, a first threshold value δ1 is set as the threshold, and the difference between an arc noise signal strength and the signal strength of another electrical path is compared with the first threshold value δ1, while in step 10, a determination on an arc noise signal strength obtained by the current sensor 9D is carried out by comparing the obtained arc noise signal strength with a predetermined second threshold value δ2. It is preferable to implement the determination in step 10 after confirming that no arc has occurred in any string as a result of carrying out arc noise strength determinations on individual strings.

Also, there is also a method of determining the threshold value δ2 in step 10 in advance before the device is installed, a method of statistically processing data when the circuits are normal after the device is installed, and calculating a standard deviation σ, thus setting, for example, 3σ as the threshold value, or the like. The current sensor 9A, 9B, 9C provided in each circuit is such that when the arc 25 occurs, the capacitor inserted in the electrical path serves as a filter and reduces the arc noise signal strength. On the other hand, the current sensor 9D at the junction can detect a noise because nothing that absorbs the noise exists between the current sensor 9D and the arc 21.

Figure 10:
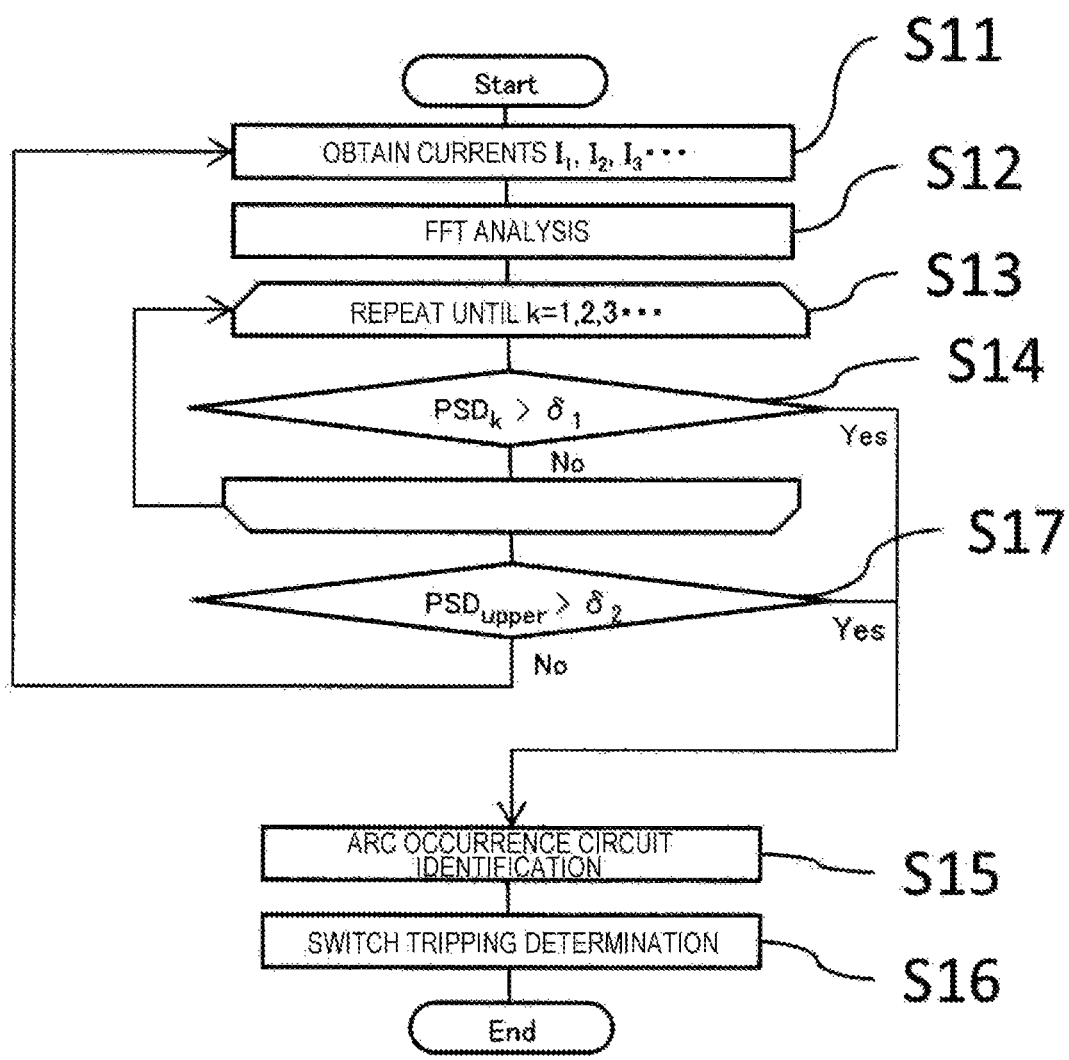
FIG. 10 is a flowchart of an arc detection of the DC feed system according to Embodiment 2 of the invention.

Also, FIG. 9 can be developed into the flow shown in FIG. 10. In the flowchart shown in FIG. 10, steps 11 to 14 and steps 15 and 16 are the same as in the flow shown in FIG. 7. The difference is that step 17 is inserted between steps 14 and 15. In step 17, a process the same as the process described in FIG. 9 is added. In the flows shown in FIGS. 9 and 10, an arc occurrence circuit determination and a switch tripping determination are techniques the same as described in FIG. 3.

Embodiment 3

Figure 11:
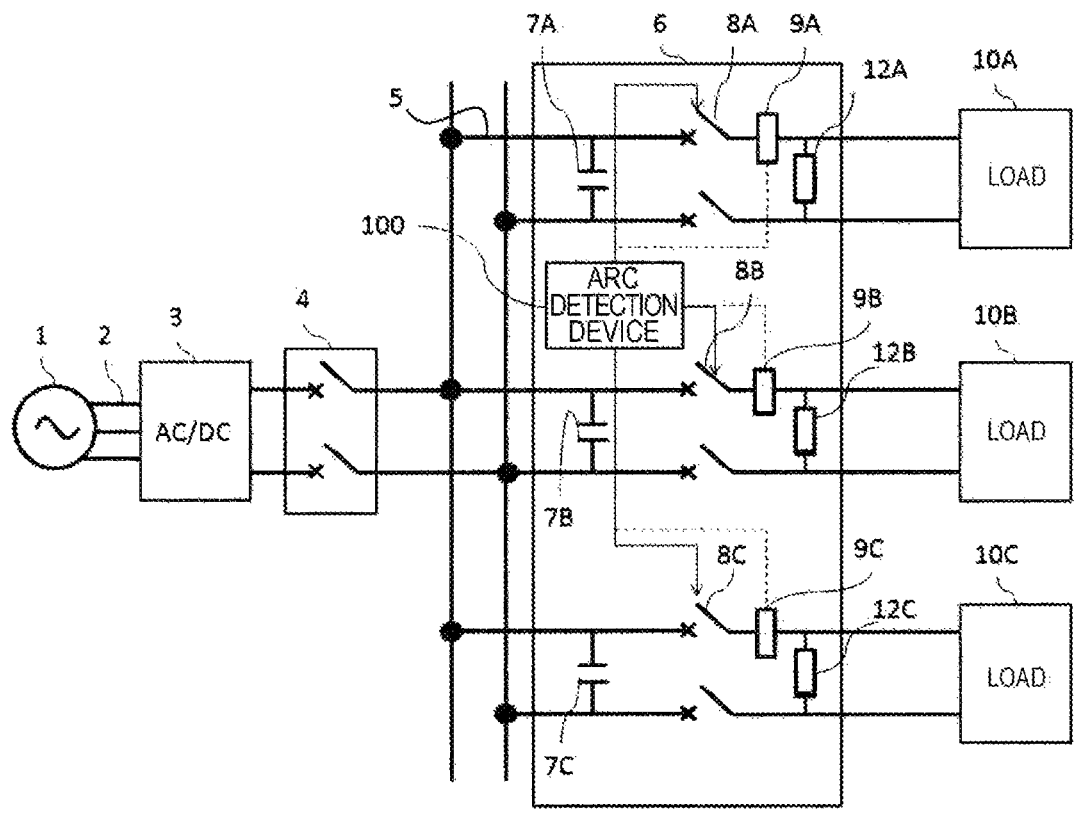
FIG. 11 is a configuration diagram showing a configuration of a DC feed system according to Embodiment 3 of the invention
Figure 12:
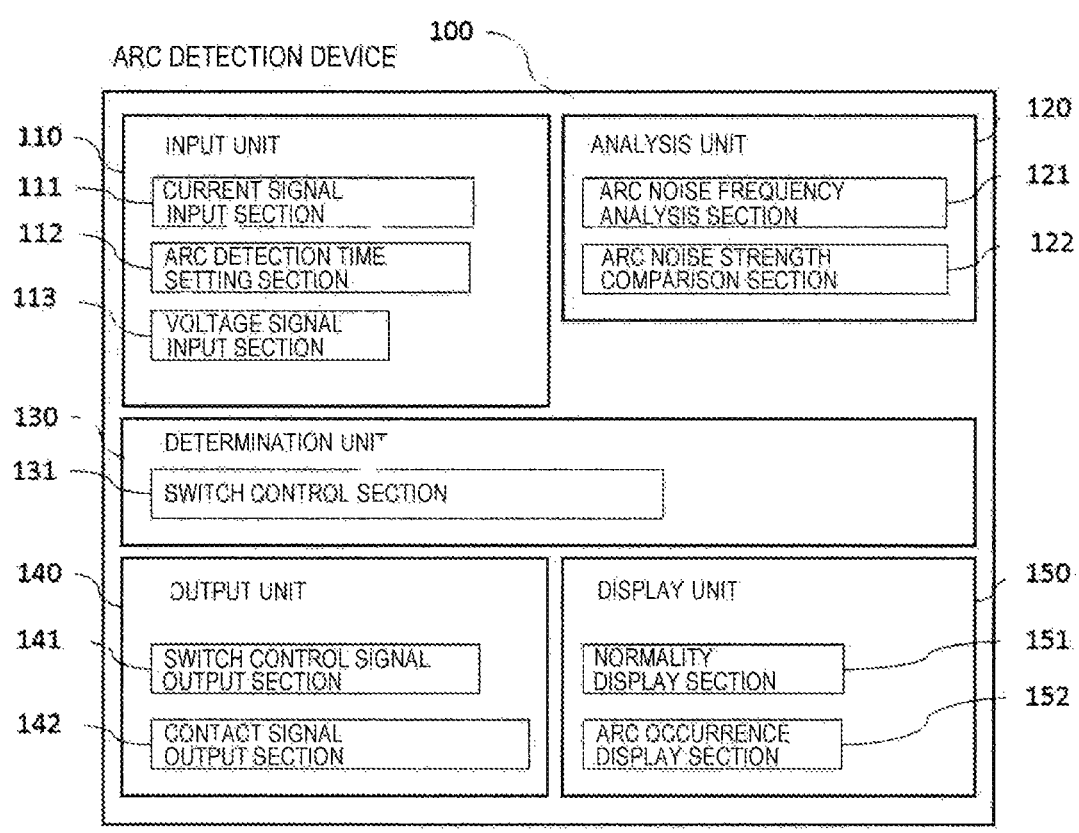
FIG. 12 is a block diagram showing a configuration of an arc detection device of the DC feed system according to Embodiment 3 of the invention.

FIG. 11 shows, as Embodiment 3, a configuration wherein a voltage sensor 12A, 12B, 12C is added between the positive and negative electrical paths in the configuration of Embodiment 1 shown in FIG. 1. In the drawing, signs identical to the signs used in FIG. 1 show respective identical or equivalent portions. At this time, the block diagram of the configuration of the arc detection device 100 of the DC feed system is as shown in FIG. 12. The block diagram shown in FIG. 12 is such that a voltage signal input section 113 is added to the block diagram of the arc detection device 100 shown in FIG. 2. In the drawing, signs identical to the signs used in FIG. 2 show respective identical or equivalent portions. The voltage signal input section 113 is provided to receive voltage signals from the voltage sensors 12A, 12B, 12C shown in FIG. 11.

Figure 13:
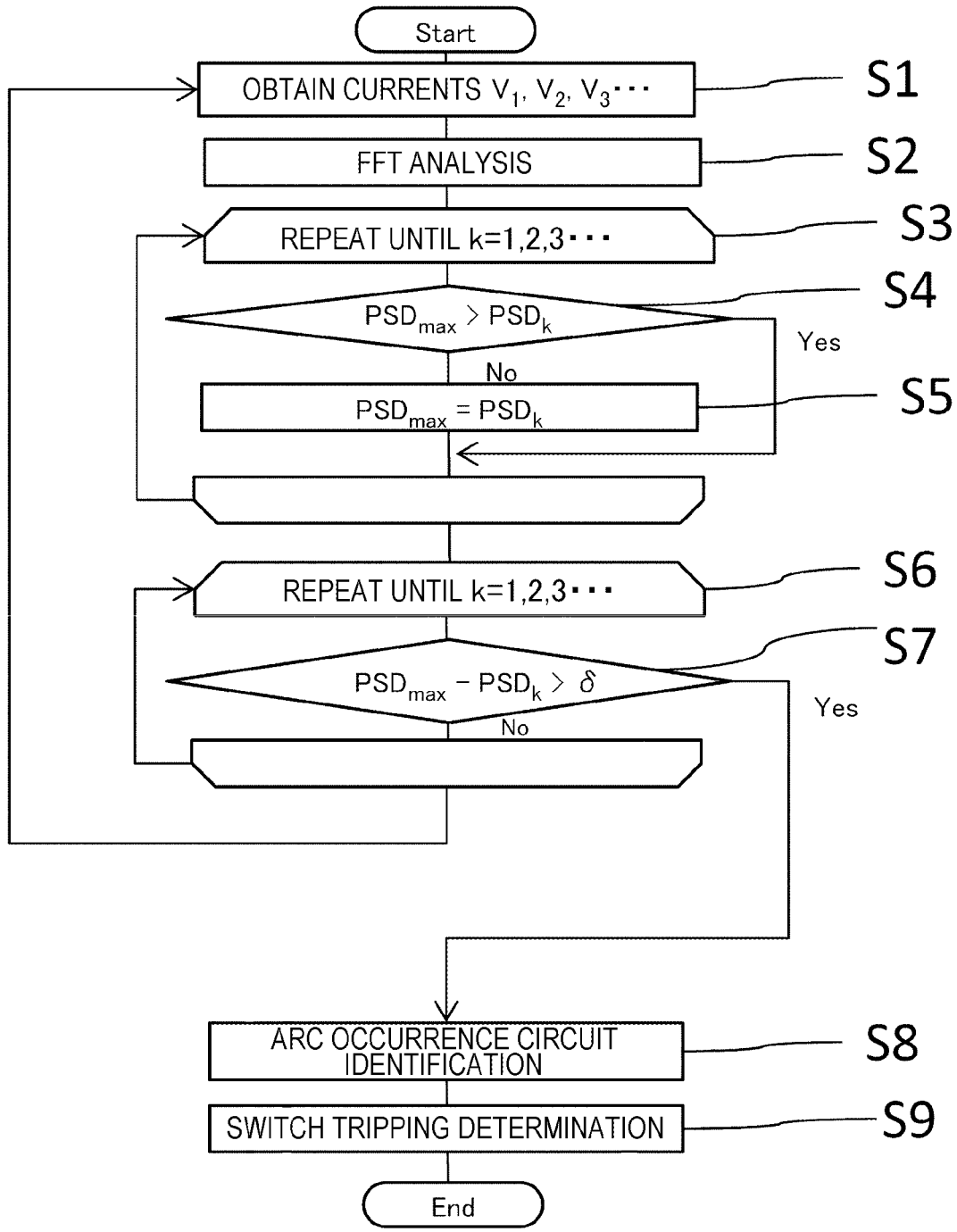
FIG. 13 is a flowchart of an arc detection of the DC feed system according to Embodiment 3 of the invention.

FIG. 13 shows a flowchart of an operation of the arc detection device 100. The flowchart shown in FIG. 13 is the same as in FIG. 3. That is, in step 1, items of information from the voltage sensors 12A, 12B, 12C are inputted, and arc noises to be superimposed on the voltage sensors 12A, 12B, 12C are detected by the strings, respectively. The processes carried out in steps 2 to 9 are of the same contents as described in FIG. 3. As a determination can be made only with voltage information, a current signal input is not necessarily required. However, in order to improve the arc detection accuracy, it is effective to carry out both an arc noise comparison of current signals and an arc noise comparison of voltage signals, rather than selectively using one comparison.

Figure 14:
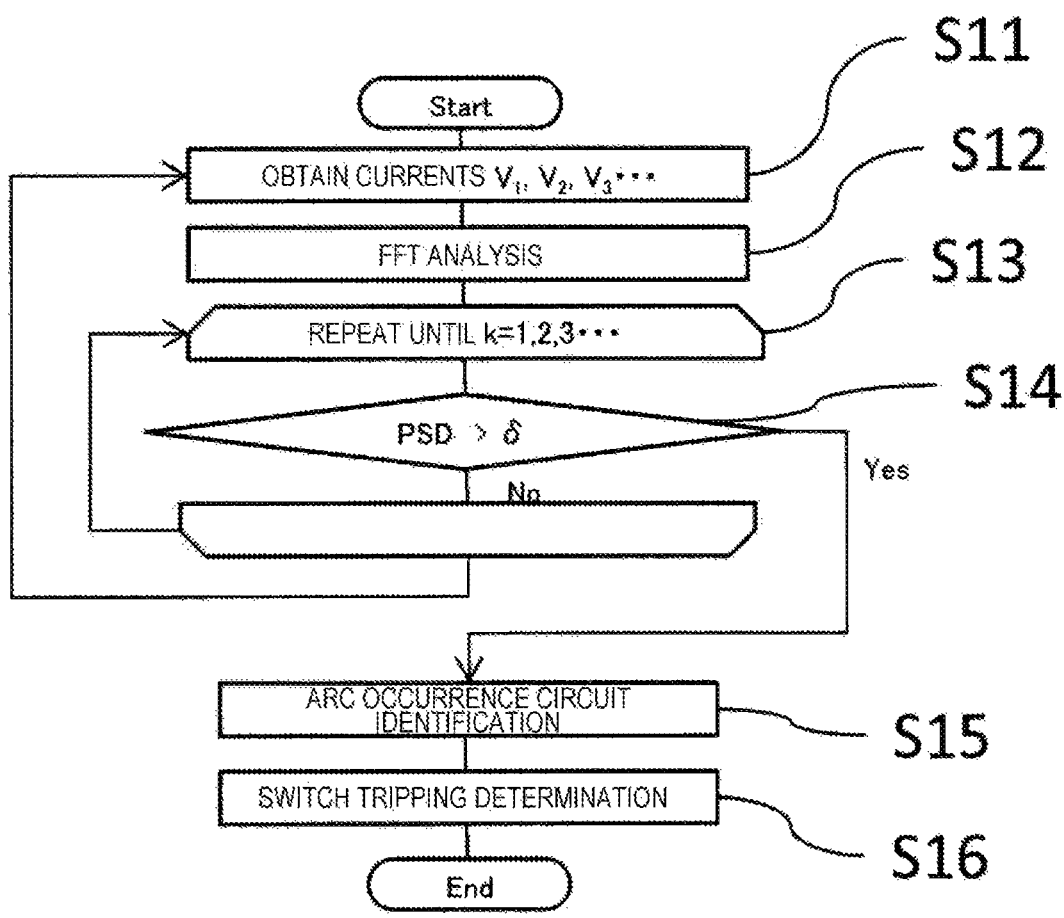
FIG. 14 is a flowchart of an arc detection of the DC feed system according to Embodiment 3 of the invention.

Also, in Embodiment 3 too, FIG. 13 can be developed into the flow shown in FIG. 14. The flowchart shown in FIG. 14 is the same as the flow shown in FIG. 7. FIG. 14 has the same contents as described in FIG. 1 except that items of information from the voltage sensors 12A, 12B, 12C are inputted in step 11.

When an arc occurs, an arc noise is superimposed not only on a current, but also on a voltage. Because of this, it is possible to identify an arc occurrence segment by comparing arc noises superimposed on voltages. For this reason, it is also possible to configure by promoting development so as to detect not only a noise superimposed on a current, but a noise superimposed on a voltage.

A DC electrical circuit protection apparatus according to the invention is used as a control center, a distribution board, a UPS, a breaker, or a power conditioner. Furthermore, there is also a configuration wherein the DC electrical circuit protection apparatus is connected to the system of a centralized control room. The DC electrical circuit protection apparatus is broadly classified into the configurations of stand-alone type, inverter mounting type, and distribution system type, but the configuration of the invention can be adopted in any type.

The invention not being limited to the configurations and operations of the embodiments, it is possible to change or omit any of the component elements of the embodiments within the scope of the invention.

The invention claimed is:

1. A DC electrical circuit protection apparatus in a DC feed system where a plurality of DC electrical circuits are connected to a common main line, the apparatus comprising:
    a plurality of current sensors each provided in at least one of a positive or a negative electrical path in each of at least two of the plurality of DC electrical circuits;
    a plurality of arc noise absorbers which are provided on an upstream side, with respect to a positive current flow direction, of each of the plurality of current sensors and which each absorb an arc noise, which occurs in one of the plurality of DC electrical circuits and flows in from the upstream side, so as not to cause the arc noise to propagate to any other DC electrical circuit; and
    an arc detection device which determines a DC electrical circuit having a largest arc noise signal strength among respective arc noise signal strengths of the plurality of DC electrical circuits from current signals detected by the plurality of current sensors, compares a difference between the largest arc noise signal strength and an arc noise signal strength of another DC electrical circuit with a threshold value, and identifies a DC electrical circuit in which an arc has occurred from among the plurality of DC electrical circuits.

2. The DC electrical circuit protection apparatus according to claim 1, wherein comparing the difference between the largest arc noise signal strength and the arc noise signal strength of the another DC electrical circuit with the threshold value is carried out based on the current signals of all the plurality of current sensors attached to the respective plurality of DC electrical circuits to which loads are connected.

3. The DC electrical circuit protection apparatus according to claim 2, comprising:
    a second current sensor provided in an electrical path at at least one of a junction of the positive electrical paths, or a junction of the negative electrical paths, of the plurality of DC electrical circuit, wherein
    the arc detection device compares respective arc noise signal strengths of the plurality of DC electrical circuits from current signals detected by the plurality of current sensors of the plurality of DC electrical circuits and from a current signal detected by the second current sensor, and based on the arc noise signal strengths, identifies the DC electrical circuit in which the arc has occurred from among the plurality of DC electrical circuits.

4. The DC electrical circuit protection apparatus according to claim 2, comprising:
    a voltage sensor provided between the positive and negative electrical paths of each of the plurality of DC electrical circuits, wherein
    the arc detection device compares respective arc noise signal strengths of the plurality of DC electrical circuits from a voltage signal detected by the voltage sensor, and based on the arc noise signal strengths, identifies the DC electrical circuit in which the arc has occurred from among the plurality of DC electrical circuits.

5. The DC electrical circuit protection apparatus according to claim 1, comprising:
    switches provided in each of the DC electrical circuits, wherein
    it is possible to electrically disconnect the DC electrical circuit in which the arc has occurred and which is identified by the arc detection device.

6. The DC electrical circuit protection apparatus according to claim 5, comprising:
a recovery device which recovers the switches, wherein an electrically disconnected switch is recovered in a predetermined time.

7. The DC electrical circuit protection apparatus according to claim 5, wherein each of the plurality of arc noise absorbers includes a capacitor provided between a corresponding switch and an electrical path.

8. The DC electrical circuit protection apparatus according to claim 5, wherein each of the plurality of arc noise absorbers includes a filter which is provided between a corresponding switch and an electrical path and which cuts a signal of 10 kHz to 100 kHz.

9. The DC electrical circuit protection apparatus according to claim 1, wherein:
each of the plurality of DC electrical circuits includes a DC load; and
each of the plurality of current sensors is positioned closer to the DC load of the corresponding one of the at least two of the plurality of DC electrical circuits than the corresponding arc noise absorber.

10. The DC electrical circuit protection apparatus according to claim 1, wherein each of the plurality of DC electrical circuits is connected to receive power from a common power source via the common main line.

11. In a DC feed system in which a plurality of DC electrical circuits are connected to a common main line and which is provided with an arc noise absorber which each absorb an arc noise, which has occurred in one of the plurality of DC electrical circuits, so as not to cause the arc noise to propagate to any other DC electrical circuit, wherein
the plurality of DC electrical circuits, each of which includes a current sensor provided in one of a positive or a negative electrical path of each of the plurality of DC electrical circuits and includes the arc noise absorber which is provided on the upstream side of the current sensor and which absorbs an arc noise flowing in from the upstream side, an arc detection method comprising:
comparing respective arc noise signal strengths of the plurality of DC electrical circuits from current signals detected by the current sensors of the plurality of DC electrical circuits, and based on the arc noise signal strengths, identifying a circuit in which an arc has occurred from among the plurality of DC electrical circuits;
an arc noise frequency analysis which carries out a frequency analysis from the current signals detected by the current sensors; and
an arc noise strength comparison which compares signal strengths of noise frequencies analyzed in the arc noise frequency analysis step, for each of the current signals detected by the current sensors, and thus identifies an arc occurrence circuit.

12. The arc detection method according to claim 11, wherein
the arc noise strength comparison selects a current signal whose signal strength has a largest value from among the current signals from all the current sensors, determines whether or not the difference in signal strength from the largest value is equal to or more than a certain value, and when the difference is equal to or more than the certain value, determines that an arc has occurred in the DC electrical circuit whose signal strength shows the largest value.

13. The arc detection method according to claim 11, wherein
the arc noise strength comparison determines that an arc has occurred in the DC electrical circuit whose signal strength value is equal to or more than a predetermined value.

14. The arc detection method according to claim 11, wherein
the arc noise strength comparison obtains data of the current signals from the plurality of current sensors and thus sets a threshold value.

* * * * *